(12) United States Patent
Kim et al.

(10) Patent No.: US 9,082,682 B2
(45) Date of Patent: Jul. 14, 2015

(54) INSULATING SHEET HAVING HETEROGENEOUS LAMINATED STRUCTURE, METHOD OF MANUFACTURING THE SAME, AND TRANSISTOR INCLUDING THE INSULATING SHEET

(71) Applicant: Samsung Electronics Co., Ltd., Suwon-Si, Gyeonggi-Do (KR)

(72) Inventors: Sang-woo Kim, Suwon-si (KR); Kang-Hyuck Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/147,871

(22) Filed: Jan. 6, 2014

(65) Prior Publication Data

US 2014/0291607 A1 Oct. 2, 2014

(30) Foreign Application Priority Data

Mar. 29, 2013 (KR) .................. 10-2013-0034789

(51) Int. Cl.
*H01L 29/06* (2006.01)
*H01L 29/16* (2006.01)

(52) U.S. Cl.
CPC ..... *H01L 29/1606* (2013.01); *Y10T 428/24355* (2015.01)

(58) Field of Classification Search
CPC ............ H01L 29/1606; C04B 22/0013; C04B 35/583; Y10T 428/24355
USPC .................. 257/9, 24, 76; 264/29.1; 428/141; 438/455, 478; 977/734, 822, 720
See application file for complete search history.

(56) References Cited

U.S. PATENT DOCUMENTS

2013/0140526 A1* 6/2013 Kim et al. ...................... 257/29

FOREIGN PATENT DOCUMENTS

| KR | 20110138611 A | 12/2011 |
| KR | 20120045910 A | 5/2012 |

OTHER PUBLICATIONS

Han Wang et al., "BN/Graphene/BN transistors for RF Applications", 2011, IEEE Electron Device Letters, vol. 32, No. 9, pp. 1209-1211, Sep. 2011.*
Liu et al., "In-plane heterostructures of graphene and hexagonal nitride with controlled domain sizes", 2013, Nature nanotechnology, vol. 8, pp. 119-124, published online Jan. 27, 2013.*
Yumeng Shi, et al. "Synthesis of a Few-Layer Hexagonal Boron Nitride Thin Film by Chemical Vapor Deposition", Nano Letters, No. 10, pp. 4134-4139, (2010).
Li Song, et al. "Large Scale Growth and Characterization of Atomic Hexagonal Boron Nitride Layers", Nano Letters, No. 10, pp. 3209-3215, (2010).

(Continued)

*Primary Examiner* — Nikolay Yushin
(74) *Attorney, Agent, or Firm* — Harness, Dickey & Pierce, P.L.C.

(57) ABSTRACT

An insulating sheet has a heterogeneous laminated structure, and includes a graphene sheet and a hexagonal boron nitride sheet on the graphene sheet, the hexagonal boron nitride sheet having a root mean square (RMS) surface roughness of about 0.5 nm or less in a region having an area of about 200 nm×200 nm or less, and one or more of longitudinal and transverse lengths of about 1 mm or more.

16 Claims, 17 Drawing Sheets

(56) References Cited

OTHER PUBLICATIONS

Lijie Ci, et al. "Atomic layers of hybridized boron nitride and graphene domains", Nature Materials, vol. 9, pp. 430-435, (2010).
C.R. Dean, et al. "Boron nitride substrates for high-quality graphene electronics", Nature Nanotechnology, vol. 5, pp. 722-726, (2010).
Zheng Liu, et al. "Direct Growth of Graphene/Hexagonal Boron Nitride Stacked Layers", Nano Letters, vol. 11, pp. 2032-2037, (2011).
Kang Hyuck Lee, et al. "Large-Scale Synthesis of High-Quality Hexagonal Boron Nitride Nanosheets for Large-Area Graphene Electronics", Nano Letters, vol. 12, pp. 714-718, (2012).

* cited by examiner

INSULATING SHEET HAVING HETEROGENEOUS LAMINATED STRUCTURE, METHOD OF MANUFACTURING THE SAME, AND TRANSISTOR INCLUDING THE INSULATING SHEET

CROSS-REFERENCE TO RELATED APPLICATIONS

This application claims the benefit of Korean Patent Application No. 10-2013-0034789, filed on Mar. 29, 2013, in the Korean Intellectual Property Office, the disclosure of which is incorporated herein in its entirety by reference.

BACKGROUND

1. Field

Some example embodiments relate to insulating sheets having a heterogeneous laminated structure, methods of manufacturing the same, and/or laminated structures and transistors including the laminated sheets, which may be used in various electrical devices.

2. Description of the Related Art

Graphene is a material composed of a single carbon atom layer having a two-dimensional planar structure, and since graphene has desirable mechanical and electrical characteristics, it has received much attention as a new high-performance electronic material. Since characteristics of graphene may significantly degrade according to its relation with respect to a substrate when the graphene is used in a real electronic device, there is a need to form a laminated structure on a substrate having insulating properties as well as an atomically flat surface in order to realize a device having desirable characteristics.

An appropriate material that may be used as a substrate for the laminated structure is hexagonal boron nitride (hereinafter, referred to as "h-BN"). h-BN is a material having a two-dimensional structure, in which the h-BN is composed of hexagonal arrays of boron atoms and nitrogen atoms, has electrical insulating properties due to a large bandgap of about 5.9 eV, and corresponds to a physically and mechanically stable material. Since an h-BN crystal has a hexagonal laminated structure similar to that of graphite, the h-BN crystal forms a very rigid bond and has lubricity. Also, an h-BN sheet is a covalently bonded material formed of elements with a low atomic number, in which the h-BN sheet has very high thermal conductivity, has very high stability at high temperatures because it does not have a melting point and sublimes at about 3000° C., has a resistance of about 105 Ω at a high temperature region above about 1000° C. due to very high electrical resistance, has high chemical stability due to very stable hexagonal bonding, and may induce weight reductions in components of aircrafts and spaceships because a true specific gravity thereof is about 2.26 which is a very low value among ceramics.

In order to use the h-BN sheet as a substrate for laminating graphene, there is a need to form an h-BN sheet having a large area as well as desirable surface characteristics.

SUMMARY

Some example embodiments provide insulating sheets having a heterogeneous laminated structure which includes an h-BN sheet having a relatively large area as well as desirable surface characteristics. Other example embodiments provide methods of manufacturing the insulating sheets. Other example embodiments provide electrical devices including the insulating sheets. Other example embodiments provide laminated structures including the insulating sheets and a graphene channel layer. Other example embodiments provide transistors including the laminated structure.

Additional aspects will be set forth in part in the description which follows and, in part, will be apparent from the description, or may be learned by practice of example embodiments.

According to an example embodiment, an insulating sheet has a heterogeneous laminated structure, and the insulating sheet includes a graphene sheet, and a hexagonal boron nitride sheet on the graphene sheet, the hexagonal boron nitride sheet having a root mean square (RMS) surface roughness of about 0.5 nm or less in a region having an area of about 200 nm×200 nm or less, and one or more of longitudinal and transverse lengths of about 1 mm or more.

The hexagonal boron nitride sheet may have a RMS surface roughness of about 2.5 nm or less in a region having an area of about 20 μm×20 μm or more. The graphene sheet may include at least one polycyclic aromatic sheet in which a plurality of carbon atoms are arranged on a single plane and connected by covalent bonds, and a thickness of the graphene sheet may be about 30 nm or less. The hexagonal boron nitride sheet may have a two-dimensional planar structure in which a boron (B)-nitrogen (N) bond is a $sp^2$ covalent bond, and a thickness of the hexagonal boron nitride sheet is about 30 nm or less. A dielectric constant of the insulating sheet may be in a range of about 2 to about 4.

According to another example embodiment, a method of manufacturing an insulating sheet having a heterogeneous laminated structure includes forming a graphene sheet by performing a first heat treatment while introducing a gas-phase carbon source in the presence of a metal catalyst, forming an amorphous boron nitride layer on the graphene sheet while providing gas-phase nitrogen and boron sources in a state in which a reactor is cooled, and recrystallizing the amorphous boron nitride layer into a hexagonal boron nitride sheet by performing a second heat treatment on the amorphous boron nitride layer.

Forming the graphene sheet, forming the amorphous boron nitride layer, and recrystallizing the amorphous boron nitride layer may be performed in a same reactor. The graphene sheet may be formed by introducing at least one of carbon monoxide, ethane, ethylene, ethanol, acetylene, propane, propylene, butane, butadiene, pentane, pentene, cyclopentadiene, hexane, cyclohexane, benzene, and toluene. The first heat treatment may be performed in the presence of at least one of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), zirconium (Zr), and an alloy thereof.

The first heat treatment may be performed at a temperature ranging from about 300° C. to about 1500° C. The first heat treatment may be performed for a given amount of time such that a thickness of the graphene sheet is about 30 nm or less. The reactor may be cooled to a temperature in a range of about 70° C. to about 800° C. The amorphous boron nitride layer may be formed by providing at least one of $NH_3$ and $N_2$, and at least one of $BH_3$, $BF_3$, $BCl_3$, $B_2H_6$, $(CH_3CH_2)_3B$, and $(CH_3)_3B$. The amorphous boron nitride layer may be formed by providing at least one of $H_3NBH_3$ and $(BH)_3(NH)_3$.

The second heat treatment may be performed at a temperature ranging from about 500° C. to about 1500° C. The graphene sheet may be formed, the amorphous boron nitride layer may be formed, and the amorphous boron nitride layer may be recrystallized in the presence of one of an inert gas, a hydrogen gas, and a mixed gas.

According to another example embodiment, an electrical device including a laminated structure, and the laminated structure includes the insulating sheet having the heterogeneous laminated structure, and a graphene channel layer on the hexagonal boron nitride sheet.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
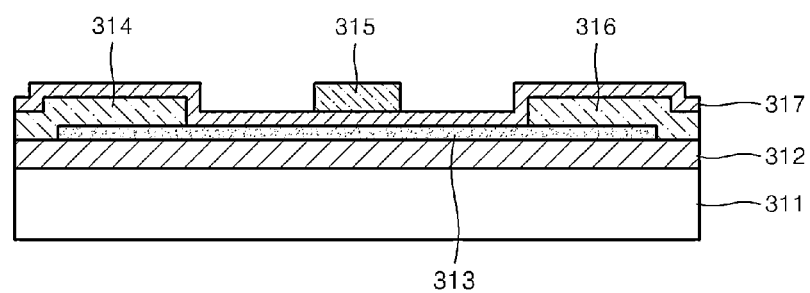
FIG. 1 is a schematic view illustrating a field-effect transistor (FET) according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in more detail.

An insulating sheet having a heterogeneous laminated structure according to an example embodiment includes a graphene sheet; and a hexagonal boron nitride sheet formed on the graphene sheet, wherein the insulating sheet may have a root mean square (hereinafter, referred to as "RMS") surface roughness of about 0.5 nm or less in a region having an area of about 200 nm×200 nm or less, and one or more of longitudinal and transverse lengths may have a value of about 1 mm or more.

In general, when a graphene channel layer exists on a SiO$_2$ substrate, charge mobility may be decreased due to surface roughness of the substrate and charge traps such as defects or dangling bonds contained in the substrate. Since the insulating sheet having a heterogeneous laminated structure may have an atomic structure very similar to that of graphene and may have flat surface characteristics by laminating a hexagonal boron nitride (h-BN) sheet theoretically having an atomically flat surface with no dangling bonds on a graphene sheet, charge mobility characteristics of a graphene channel layer in an electrical device, such as a field-effect transistor (FET), may be improved when the insulating sheet having a heterogeneous laminated structure is used as a substrate for lamination.

The graphene sheet is formed by laminating one or a plurality of polycyclic aromatic sheets in which a plurality of carbon atoms are arranged on a single plane by being connected by covalent bonds (typical sp$^2$ bond) to one another, wherein the carbon atoms connected by covalent bonds may form a 6-membered ring as a basic repeating unit, but a 5-membered ring and/or a 7-membered ring may be further included.

The graphene sheet may be composed of a single layer of carbon atoms covalently bonded to one another, and many single layers may be laminated to one another to form a multilayer. In this case, the single layers may be laminated to have a nanoscale thickness. A thickness of the graphene sheet is about 30 nm or less, may be about 20 nm or less, and for example, may be about 15 nm or less. Since the graphene sheet is formed to have a nanoscale thickness, insulating properties of the insulating sheet may not be deteriorated.

The nanosized graphene sheet may have a large area. An area of a sheet may be defined by a width and a length, or transverse and longitudinal lengths. According to an example embodiment, one or more of transverse and longitudinal lengths of the nanosized graphene sheet has a value of about 1 mm or more, may have a value of about 1 cm or more, and for example, may have a value of about 1 inch or more or about 2 inches or more.

An area of the graphene sheet is about 0.5 mm$^2$ or more, may be about 1 mm$^2$ or more, and for example, may be about 10 mm$^2$ or more or about 1 cm$^2$ or more. For example, the area of the graphene sheet may be in a range of about 1 mm$^2$ to about 10 cm$^2$.

The graphene sheet formed in a large area may be a basis on which a high-quality hexagonal boron nitride sheet may be formed to have a large area.

An h-BN sheet is formed on the graphene sheet to constitute an insulating sheet having a heterogeneous laminated structure.

The h-BN sheet has a two-dimensional planar structure, in which a boron (B)-nitrogen (N) bond is a sp$^2$ covalent bond and a bond between layers may include a van der Waals bond. The h-BN sheet may have low surface roughness as well as a large area by being formed on the graphene sheet having a nanoscale thickness and a large area.

The surface roughness of the h-BN sheet denotes roughness of a surface of the sheet, and in a case where impurity particles or wrinkles exist on the surface thereof, a value of the surface roughness is high. In contrast, the value of the surface roughness decreases as the impurity particles or wrinkles existed on the surface thereof are reduced and smooth surface is obtained. Surface roughness of the insulating sheet having a heterogeneous laminated structure may be determined by the surface roughness of the h-BN sheet.

The surface roughness of the h-BN sheet or the insulating sheet may be represented as RMS surface roughness. A value of the RMS surface roughness may be obtained by measuring surface roughness on the surface of the h-BN sheet. According to an example embodiment, the insulating sheet having a heterogeneous laminated structure may have a RMS surface roughness of about 0.5 nm or less in a region having an area of about 200 nm×200 nm or less. The above RMS surface roughness obtained in the microscopic region having an area of about 200 nm×200 nm or less denotes that the insulating sheet has flat surface characteristics in comparison to the SiO$_2$ substrate. For example, the insulating sheet having a heterogeneous laminated structure may have a RMS surface roughness of about 0.45 nm or less in a microscopic region having an area of about 200 nm×200 nm or less.

Also, the insulating sheet having a heterogeneous laminated structure may have a RMS surface roughness of about 2.5 nm or less in a region having an area of about 20 μm×20 μm or more. The RMS surface roughness of the insulating sheet having a heterogeneous laminated structure is lower than that of an h-BN sheet laminated by a typical manufacturing method even in a region wider than the microscopic region having an area of about 200 nm×200 nm or less. For example, the insulating sheet having a heterogeneous laminated structure may have a RMS surface roughness of about 2.3 nm or less in a region having an area of about 20 μm×20 μm or more.

Such smooth and flat surface characteristics may contribute to improve performance of an electrical device using graphene as a channel.

The h-BN sheet may have a thickness of a single atomic layer, or may have a multilayer structure having two or more atomic layers. For example, the h-BN sheet may have a multilayer structure laminated to a thickness of about 30 nm or less, specifically, about 20 nm or less, and more specifically, about 10 nm or less. When the h-BN sheet is used in a graphene transistor in a case where the thickness of the h-BN sheet is within the above range, the h-BN sheet may maintain or improve characteristics of the device without significantly reducing gate dielectric permittivity.

Similar to the graphene sheet, one or more of transverse and longitudinal lengths of the h-BN sheet has a value of about 1 mm or more, may have a value of about 1 cm or more, and for example, may have a value of about 1 inch or more or about 2 inches or more.

A dielectric constant of the insulating sheet may be in a range of about 2 to about 4. For example, the dielectric constant of the insulating sheet may be in a range of about 2.45 to about 3.6. For example, the dielectric constant of the insulating sheet may be in a range of about 3.0 to about 3.6. For example, the dielectric constant of the insulating sheet may be in a range of about 3.3 to about 3.6.

As described above, since the insulating sheet having the heterogeneous laminated structure including the graphene sheet and h-BN sheet may have desirable surface characteristics and a large area, the insulating sheet having the heterogeneous laminated structure may be used in various electrical devices using the insulating sheet as a substrate. In particular, when the insulating sheet having the heterogeneous laminated structure is used in a graphene-based electronic device, more stable and improved performance may be obtained. For example, when a graphene channel layer using the insulating sheet having the heterogeneous laminated structure as a substrate is realized as a FET, electron mobility characteristics may be significantly improved. According to an example embodiment, it may be confirmed that electron mobility of a graphene FET having a laminated structure of the insulating sheet and the graphene channel layer is improved about 8 times or more in comparison to a FET using a silica substrate.

The insulating sheet having a heterogeneous laminated structure may be manufactured by using a chemical vapor deposition method. According to an example embodiment, in a method of manufacturing the insulating sheet having a heterogeneous laminated structure, a large-area graphene sheet is firstly synthesized by sequentially providing raw materials while processing conditions are controlled in a single reactor (e.g., chamber, furnace, etc.), and a hexagonal boron nitride sheet having desirable surface characteristics may be laminated thereon in a large area.

A method of manufacturing an insulating sheet having a heterogeneous laminated structure according to an example embodiment may include: forming a graphene sheet by performing a first heat treatment while introducing a gas-phase carbon source in the presence of a metal catalyst; forming an amorphous boron nitride layer on the graphene sheet while providing gas-phase nitrogen and boron sources in a state in which a reactor is cooled; and performing a second heat treatment on the amorphous boron nitride layer to recrystallize into a hexagonal boron nitride sheet.

According to an example embodiment, the forming of the graphene sheet, the forming of the amorphous boron nitride layer, and the recrystallizing of the amorphous boron nitride layer into the hexagonal boron nitride sheet may be performed in the same reactor.

First, in order to form a graphene sheet, a first heat treatment is performed at a first temperature while a gas-phase carbon source is introduced into a reactor in the presence of a metal catalyst. When the first heat treatment is performed at a given (or alternatively, predetermined) temperature for a given (or alternatively, predetermined) period of time while the gas-phase carbon source is provided at a given (or alternatively, predetermined) pressure into the reactor in which the metal catalyst is contained, a graphene sheet may be formed while carbon components included in the gas-phase carbon source are bonded to one another to form a hexagonal plate structure.

A metal catalyst in the form of a layer may be independently used or if necessary, a metal catalyst included in a substrate may be used as the metal catalyst usable in a process of forming the graphene sheet. In particular, with respect to a metal catalyst in the form of a thin film, a substrate may be used for the convenience of the manufacturing process. As the substrate, an inorganic substrate such as a silicon (Si) substrate, a SiC substrate, a glass substrate, a GaN substrate, a silica substrate, and a sapphire substrate, a metal substrate such as a nickel (Ni) substrate, a copper (Cu) substrate, and a tungsten (W) substrate, and a carbon substrate such as a graphite substrate may be used. A surface of the substrate may be coated in advance with a blocking layer in order to inhibit an unnecessary reaction between the substrate and the metal catalyst. The blocking layer is included between the substrate and the metal catalyst layer, and thus, a reduction in formation efficiency of the graphene sheet by the reaction of the metal catalyst with the substrate may be prevented or reduced. A material, such as $SiO_x$, TiN, $Al_2O_3$, $TiO_2$, and $Si_3N_4$, may be used as the blocking layer and the blocking layer may be formed on the substrate by using a method such as sputtering.

The metal catalyst assists the carbon components provided from the carbon source to be bonded to one another to form a hexagonal plate structure by being in contact with the carbon source. For example, a catalyst used for synthesizing graphite, inducing a carbonization reaction, or preparing carbon nanotubes may be used. Specifically, one or more selected from the group consisting of Ni, cobalt (Co), iron (Fe), platinum (Pt), gold (Au), aluminum (Al), chromium (Cr), Cu, magnesium (Mg), manganese (Mn), molybdenum (Mo), rhodium (Rh), Si, tantalum (Ta), titanium (Ti), W, uranium (U), vanadium (V), and zirconium (Zr) may be used. A plate structure formed of the above metal alone may be used as the metal catalyst, and the metal catalyst may be fixed on the substrate by using a method such as vapor deposition or sputtering. A metal catalyst in the form of a thin film or thick film may be used as the metal catalyst.

In a case where the metal catalyst in the form of a layer is a thin film, the metal catalyst formed on a substrate may be used in terms of the manufacturing process. For example, since a contact between the thin film and the substrate may be weakened at a temperature greater than about 700° C. and a portion of the thin film may be melted, a thick film that does not require the use of a substrate may be used in a case where a high-temperature heat treatment performed above about 700° C. is used. With respect to the thin film metal catalyst, a thickness thereof, for example, is in a range of about 1 nm to about 1,000 nm, and may be in a range of about 10 nm to about 100 nm. With respect to the thick film metal catalyst, a thickness thereof, for example, is in a range of about 0.01 mm to about 5 mm, and may be in a range of about 0.1 mm to about 1 mm.

Carbon may be provided as the carbon source and any material capable of existing in a gas phase at a temperature above about 300° C. may be used without particular limitation. A compound containing carbon may be used as the gas-phase carbon source. A compound having a carbon number of about 6 or less is used, a compound having a carbon number of about 4 or less may be used, and for example, a compound having a carbon number of about 2 or less may be used. For example, one or more selected from the group consisting of carbon monoxide, ethane, ethylene, ethanol, acetylene, propane, propylene, butane, butadiene, pentane, pentene, cyclopentadiene, hexane, cyclohexane, benzene, and toluene may be used.

The carbon source may be introduced into the reactor containing the metal catalyst at a given (or alternatively, predetermined) pressure, and for example, the carbon source may be provided at a flow rate ranging from about 1 sccm to about 100 sccm.

In the reactor, the carbon source may be contained alone or may be contained with an inert gas such as nitrogen, helium, and argon. For example, the inert gas may be provided into the reactor at a flow rate ranging from about 100 sccm to about 1,000 sccm, and specifically, from about 300 sccm to about 700 sccm.

Also, a reducing gas, such as hydrogen gas, may be used with the carbon source. Hydrogen may be used to control a gas-phase reaction by maintaining a surface of the metal catalyst clean. For example, the hydrogen gas may be provided into the reactor at a flow rate ranging from about 100 sccm to about 1,000 sccm, and specifically, from about 300 sccm to about 700 sccm.

The carbon source may be provided in a mixed gas atmosphere of an inert gas and hydrogen gas.

When the gas-phase carbon source is introduced into the reactor containing the metal catalyst in the form of a layer and the first heat treatment is then performed, a graphene sheet may be formed on the surface of the metal catalyst. A temperature during the first heat treatment may be determined within a range in which the graphene may grow in the form of a sheet while the metal catalyst is not damaged. The first heat treatment, for example, may be performed at a temperature ranging from about 300° C. to about 1500° C., and specifically, from about 500° C. to about 1000° C. In a case where the metal catalyst is in the form of a thick film, the first heat treatment may be performed at a temperature higher than that in a case where the metal catalyst is in the form of a thin film.

The first heat treatment may control a degree of formation of the graphene sheet by being held at a given (or alternatively, predetermined) temperature for a given (or alternatively, predetermined) period of time. That is, since an amount of the graphene formed is increased when the first heat treatment is maintained over a prolonged period of time, a resultant thickness of the graphene sheet may be increased. When the first heat treatment is performed for a shorter period of time, the resultant thickness of the graphene sheet may be decreased. Therefore, in order to obtain a targeted thickness of the graphene sheet, a first heat treatment holding time may be controlled in addition to a type and supply pressure of the carbon source, a type of the metal catalyst, and a size of the reactor. When the first heat treatment holding time is excessively short, a sufficient amount of the graphene sheet may not be obtained, and when the first heat treatment holding time is excessively long, the formed graphene sheet may be too thick, and thus, graphitization may be performed. Therefore, in consideration of such a situation, the first heat treatment holding time may be appropriately controlled so as to obtain a thickness of the graphene sheet of about 30 nm or less. For example, the first heat treatment may be maintained for about 0.001 hours to about 1,000 hours.

Any heat source, such as induction heating, radiant heat, laser, infrared (IR), microwaves, plasma, ultraviolet (UV), and surface plasmon heating, may be used as a heat source for the first heat treatment without limitation. The heat source is attached to the reactor to increase a temperature of the reactor to a given (or alternatively, predetermined) temperature.

After the first heat treatment, a product of the first heat treatment may be subjected to a given (or alternatively, predetermined) cooling process. The cooling process may assist the formed graphene to uniformly grow to be regularly arranged in the form of a sheet. Since rapid cooling may cause cracks in the graphene sheet being formed, the cooling may be slowly performed at a given (or alternatively, predetermined) rate. For example, the cooling may be performed at a rate ranging from about 0.1° C./min to about 10° C./min, and may be performed by using a method such as natural cooling. The natural cooling is performed by simply removing the heat source used in the heat treatment, in which a sufficient cooling rate may be obtained by only the removal of the heat source. The above-described first heat treatment and cooling process may be performed in a single cycle process. However, a graphene sheet having a dense structure may be formed by repeating the single cycle process many times.

The graphene sheet obtained after the first heat treatment may be formed as a single layer or a multilayer having a thickness of about 30 nm or less, and one or more of transverse and longitudinal lengths of the graphene sheet has a value of about 1 mm or more, may have a value of about 1 cm or more, and for example, may have a value ranging from about 1 cm to about 1,000 m. An area of the graphene sheet, for example, may be easily controlled by freely controlling a size of the substrate having the metal catalyst formed thereon.

Since the large-area graphene sheet having a nanoscale thickness itself has a very smooth and flat surface while not inhibiting insulating properties of the insulating sheet to be finally obtained, an h-BN sheet having desirable surface characteristics may be formed in a large area when the h-BN sheet is formed on the large-area graphene sheet.

The graphene sheet thus obtained may be identified by a Raman spectrum. That is, since graphene in the form of a sheet exhibits a D peak near about 1345 cm$^{-1}$ and a G peak near about 1600 cm$^{-1}$ in the Raman spectrum, the formation of the graphene sheet may be confirmed by the presence of such peaks. Also, the thickness of the graphene sheet may be confirmed by a result of step height measurements with respect to the substrate.

Next, an amorphous boron nitride layer is formed on the graphene sheet while gas-phase nitrogen and boron sources are provided to the reactor that is in a cooled state after the first heat treatment.

According to an example embodiment, the forming of the amorphous boron nitride layer by providing the nitrogen source and the boron source, and the forming of the hexagonal boron nitride sheet by performing the second heat treatment on the amorphous boron nitride layer may be continuously performed in the same reactor as that used in the formation of the graphene sheet. Since the h-BN sheet is formed by sequentially providing raw materials in a single reactor, it may be very advantageous in terms of a yield with respect to energy and time required during the manufacturing of the insulating sheet having a heterogeneous laminated structure and an h-BN sheet having desirable surface characteristics may be synthesized, in comparison to a process of forming an h-BN sheet by using another reactor after the formation of the graphene sheet.

A temperature during the cooling is not particularly limited, and the cooling may be performed within a temperature range in which an amorphous boron nitride layer is stably formed while the nitrogen source and the boron source are provided in a gas phase. A temperature of the reactor in a cooled state is lower than the first heat treatment temperature, and for example, may be in a range of about 70° C. to about 800° C. For example, the temperature of the reactor may be in a range of about 70° C. to about 400° C. Specifically, the temperature of the reactor may be in a range of about 100° C. to about 400° C., and for example, may be in a range of about 300° C. to about 400° C.

The nitrogen source is not particularly limited so long as it may provide gas-phase elemental nitrogen, and may include one or more selected from $NH_3$ and $N_2$.

The boron source is not particularly limited so long as it may provide gas-phase elemental boron, and may include one or more selected from the group consisting of $BH_3$, $BF_3$, $BCl_3$, diborane ($B_2H_6$), $(CH_3CH_2)_3B$, and $(CH_3)_3B$.

According to an example embodiment, one or more selected from borazane ($H_3NBH_3$) and borazine (($BH)_3(NH)_3$) may be used as a source capable of providing both nitrogen and boron.

The nitrogen source and the boron source may be provided in a gas phase into a chamber. However, raw materials themselves are not necessary to be a gas phase and solid-phase materials containing nitrogen and boron may be used by being evaporated in an external container.

That is, a solid-phase nitrogen and boron-containing compound may be stored in the external container, and the compound may be then evaporated, for example, sublimated by heating at a given (or alternatively, predetermined) temperature. Then, the sublimated compound may be provided into the chamber in which the metal catalyst is disposed.

The gas-phase nitrogen and boron sources evaporated in the external container may be provided into the chamber with nitrogen gas. At this time, since contents of nitrogen and boron provided into the chamber may be adjusted by appropriately controlling a temperature of the external container and a flow rate of the nitrogen gas, growth of the h-BN thus obtained may be controlled.

An ammonia-borane ($NH_3$—$BH_3$) compound may be used as the solid-phase nitrogen and boron-containing compound stored in the external container. Since the evaporation of the ammonia-borane compound occurs at about 130° C., amounts of evaporated $NH_3$ and $BH_3$ may be appropriately controlled by adjusting the temperature.

The gas-phase nitrogen and boron sources may be provided at a constant flow rate into the reactor, and for example, the nitrogen source and the boron source at a stoichiometric ratio of about 1:1 may be provided at a flow rate ranging from about 1 sccm to about 100 sccm.

Also, the nitrogen source and the boron source may be provided in an inert atmosphere and/or a reducing atmosphere. An inert gas, such as nitrogen gas, argon gas, or helium gas, may be used for producing the inert atmosphere, and the reducing atmosphere may be produced by using hydrogen gas. Both inert gas and hydrogen gas may be provided in the form of a mixed gas. For example, the inert gas may be provided at a flow rate ranging from about 100 sccm to about 1,000 sccm, specifically, about 300 sccm to about 700 sccm into the reactor. For example, the hydrogen gas may be provided at a flow rate ranging from about 100 sccm to about 1,000 sccm, specifically, about 300 sccm to about 700 sccm into the reactor.

The nitrogen source and the boron source thus provided form an amorphous boron nitride layer on the graphene sheet.

Thereafter, an h-BN sheet is formed by performing a second heat treatment on the amorphous boron nitride layer. The second heat treatment is a process of recrystallizing the amorphous boron nitride layer to obtain a hexagonal crystal structure and may be performed at an appropriate temperature for a given (or alternatively, predetermined) period of time. For example, the second heat treatment may be performed at a temperature ranging from about 500° C. to about 1,500° C., specifically, about 800° C. to about 1,200° C. for about 1 minute to about 2 hours. A recrystallized h-BN sheet may be formed on the graphene sheet by the second heat treatment.

Any heat source, such as induction heating, radiant heat, laser, infrared (IR), microwaves, plasma, ultraviolet (UV), and surface plasmon heating, may be used as a heat source for the second heat treatment without limitation. The heat source is attached to the chamber to increase a temperature of the chamber to a given (or alternatively, predetermined) temperature.

A product obtained by the second heat treatment may be further subjected to a given (or alternatively, predetermined) cooling process. Herein, the cooling process is a process for assisting the formed h-BN to uniformly grow to be regularly arranged in the form of a sheet, in which the cooling, for example, may be performed at a rate ranging from about 10° C./min to about 100° C./min. An inert gas and/or hydrogen gas may be provided at a constant flow rate for the cooling. Also, the cooling may be performed by using a method such as natural cooling, and the natural cooling may be performed by stopping an operation of the heat source or removing the heat source from the reactor. The above-described second heat treatment and cooling process may be performed in a single cycle process. However, an h-BN sheet having a dense structure as well as many layers may be formed by repeating the single cycle process many times. For example, crystallinity and purity of the h-BN may be increased by repeating the second heat treatment two or three times.

The h-BN sheet obtained by the above-described second heat treatment may have a thickness of a single atomic layer, or may have a multilayer structure having two or more atomic layers. For example, the h-BN sheet may be formed to have a thickness of about 30 nm or less, specifically about 20 nm or less, and more specifically, about 10 nm or less.

The h-BN sheet alone may be identified by a Raman spectrum. In the Raman spectrum, the h-BN sheet provides a specific band with a peak at about 1,367 $cm^{-1}$ corresponding to a B—N vibrational mode ($E_{2g}$) of h-BN. In general, in a case where an h-BN sheet exists alone, the purity of h-BN may be calculated according to a shape of the peak at about 1,367 $cm^{-1}$ in the Raman spectrum. For example, since a value of a full width at half maximum (FWHM) of the peak at about 1,367 $cm^{-1}$ becomes high due to the superposition of peaks when allotropes such as cubic boron nitride (c-BN) or amorphous boron nitride (a-BN), or boron carbon nitride ($B_xC_yN_z$) and/or hetero components of BN soot are included, the crystallinity of the h-BN sheet may be identified by the FWHM of the peak at about 1,367 $cm^{-1}$. However, with respect to the h-BN sheet formed on the graphene sheet, since the peak at about 1,367 $cm^{-1}$ of the h-BN sheet may be overlapped with the D peak of the graphene sheet appeared near about 1345 $cm^{-1}$ in a Raman spectrum, accurate identification may be difficult if only the Raman spectrum is used.

Therefore, X-ray photoelectron spectroscopy (XPS) and transmission electron microscope-electron energy loss spectroscopy (TEM-EELS) may be used as a method of specifically identifying the h-BN sheet formed on the graphene sheet. When the presence of B—N and C—C bondings and a map of each element, such as boron (B), carbon (C), and nitrogen (N), are respectively identified from results of XPS measurements and results of TEM-EELS measurement, a heterogeneous laminated structure may be identified, in which the h-BN sheet is formed on the graphene sheet.

The h-BN sheet synthesized on the large-area graphene sheet through process control during chemical vapor deposition may exhibit flat surface characteristics in a region having an area of about 20 μm×20 μm or more as well as a microscopic region having an area of about 200 nm×200 nm or less. According to an example embodiment, the h-BN sheet structure may have a RMS surface roughness of about 0.5 nm or less, for example, about 0.45 nm or less in the microscopic region having an area of about 200 nm×200 nm or less, and may have a RMS surface roughness of about 2.5 nm or less, for example, about 2.3 nm or less in the region having an area of about 20 μm×20 μm or more.

One or more of transverse and longitudinal lengths of the h-BN sheet thus prepared has a value of about 1 mm or more, may have a value of about 1 cm or more, and for example, may have a value of about 1 inch or more or about 2 inches or more. Thus, a large-area h-BN sheet may be obtained on the basis of the large-area graphene sheet.

Since the h-BN sheet thus formed has a smooth surface and less defects, the insulating sheet including the h-BN sheet may be used in various electrical devices. For example, since the insulating sheet has a physically and mechanically stable structure and desirable insulating properties and transparency, the insulating sheet may be used as an insulation layer of solar cells, display devices, or various transistors.

Also, the h-BN sheet in the insulating sheet has a low lattice mismatch of about 1.7% and simultaneously, does not include charged impurities on its surface because dangling bonds are not formed in terms of structure. Therefore, the insulating sheet including the h-BN sheet may be used as a support in a graphene-based electronic device, instead of silicon dioxide ($SiO_2$). In this case, the insulating sheet does not degrade performance of a graphene channel layer and also has desirable transparency and ductility, and thus, performance of the graphene-based electronic device may be improved.

According to another embodiment, a laminated structure of the insulating sheet including the h-BN sheet and the graphene channel layer may be used in various electrical devices, for example, sensors, bipolar junction transistors (BJTs), FETs, heterojunction bipolar transistors (HBTs), single electron transistors, light-emitting diodes (LEDs), and organic light-emitting diodes (OLEDs). The insulating sheet in the laminated structure of the insulating sheet and the graphene channel layer in the above devices may be used as a buffer layer between an electrode and the graphene channel layer.

An example of a FET among the above devices is illustrated in FIG. 1. In FIG. 1, a silica substrate 312 is disposed on a substrate 311, and a channel layer 313 is disposed on the silica substrate 312. The channel layer 313 may be a graphene channel layer. A source electrode 314 and a drain electrode 316 are disposed on the left and right sides of the channel layer 313 and a gate electrode 315 is disposed on the channel layer 313 having an insulation layer 317 therebetween. Herein, a voltage is applied to the gate electrode 315 to control a current flowing between the source electrode 314 and the drain electrode 316. That is, the graphene channel layer 313 constitutes a channel region and the voltage applied to the gate electrode 315 controls the current flowing between the source electrode 314 and the drain electrode 316 to control an on/off operation. In the FET, the insulating sheet including a high-quality and large-area h-BN sheet may be used as an insulation layer.

Figure 2:
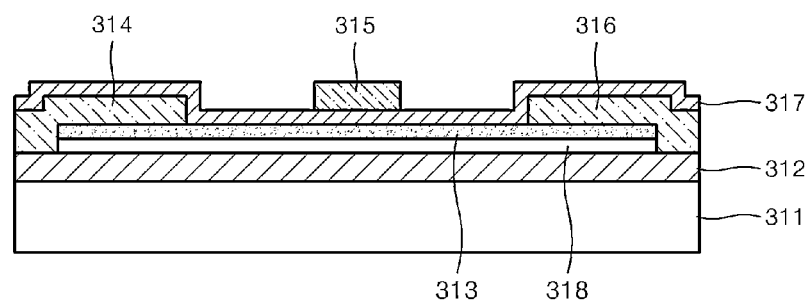
FIG. 2 is a schematic view illustrating a FET according to another example embodiment.

An example of another FET is illustrated in FIG. 2. In FIG. 2, a buffer layer 318 may be disposed between a channel layer 313 and a silica substrate 312 in order to control scattering of charges of the channel layer 313 during the movement caused by roughness of a surface of the silica substrate 212 and dangling bonds, and the insulating sheet including a high-quality and large-area h-BN sheet may be used as the buffer layer 318.

As another embodiment, the buffer layer 318 is disposed between the channel layer 313 and the insulation layer 317 in order to improve injection efficiency, and the insulating sheet including an h-BN sheet may be used as the buffer layer 318.

The FET may be a back-gate FET.

Hereinafter, the inventive concepts will be described in more detail, according to the following examples. However, the inventive concepts are not limited thereto.

Example 1

—Graphene Sheet Synthesis (First Heat Treatment)

A copper foil having an area of about 2 cm×10 cm and a thickness of about 125 μm was disposed in a chemical vapor deposition (CVD) chamber, and the temperature was gradually increased to about 900° C. for about 1 hour by using an inductive heat source. Subsequently, a heat treatment was performed at about 900° C. for about 1 hour while $CH_4$ gas was constantly introduced into the chamber at a flow rate of about 5 sccm. Thereafter, the heat source was removed and the chamber was naturally cooled. The chamber was cooled to about 400° C. and a synthesized graphite sheet was then obtained.

$N_2$ gas at a flow rate of about 500 sccm and $H_2$ gas at a flow rate of about 500 sccm were provided into the CVD chamber throughout the synthesis process of the graphene sheet.

The synthesized graphene sheet was transferred to a $SiO_2$ substrate having a thickness of about 100 nm, and the presence of the synthesized graphene sheet and a thickness thereof were identified through experimental examples to be described later.

—Amorphous BN Layer Formation

Borazine $((BH)_3(NH)_3)$ as a raw material of h-BN was introduced into a separate heating chamber and gas-phase borazine was obtained by sublimating the borazine at a temperature ranging from about 110° C. to about 130° C. with nitrogen gas having a flow rate of about 10 sccm.

The graphene sheet transferred to the $SiO_2$ substrate was disposed in the CVD chamber that had been cooled to about 400° C., and an amorphous boron nitride layer was formed on the graphene sheet while providing the gas-phase borazine into the CVD chamber for about 1 hour.

$N_2$ gas at a flow rate of about 500 sccm and $H_2$ gas at a flow rate of about 500 sccm were provided into the CVD chamber during the formation of the amorphous BN layer.

—h-BN Sheet Formation (Second Heat Treatment)

A temperature of the CVD chamber was gradually increased to about 1,000° C. for about 40 minutes and a heat treatment was then performed at about 1,000° C. for about 1 hour to grow h-BN. Subsequently, the heat source was removed and an h-BN sheet formed on the graphene sheet was obtained by naturally cooling the chamber for about 4.5 hours. $N_2$ gas at a flow rate of about 500 sccm and $H_2$ gas at a flow rate of about 500 sccm were provided into the CVD chamber throughout the formation process of the BN sheet.

Thus, an insulating sheet having a heterogeneous laminated structure of the graphene sheet and the h-BN sheet was manufactured.

Experimental Example 1

Analysis of Synthesized Graphene Sheet

In order to identify the graphene sheet obtained by the first heat treatment in Example 1, the graphene sheet transferred to the $SiO_2$ substrate was analyzed by using an atomic force microscope (AFM), an optical microscope (OM), and a Raman spectrum.

Figure 3A:
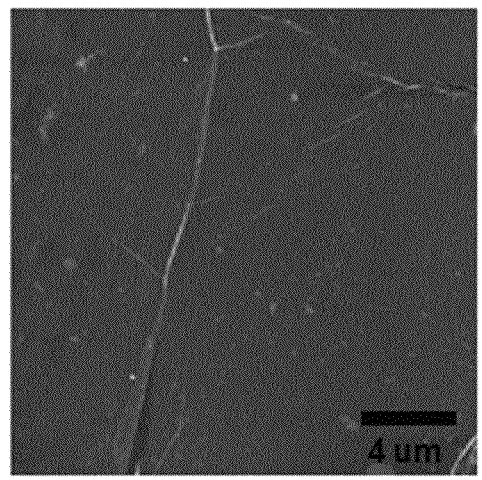
FIGS. 3A and 3B are respective atomic force microscope (AFM) images of a graphene sheet obtained by a first heat treatment in Example 1.
Figure 3B:
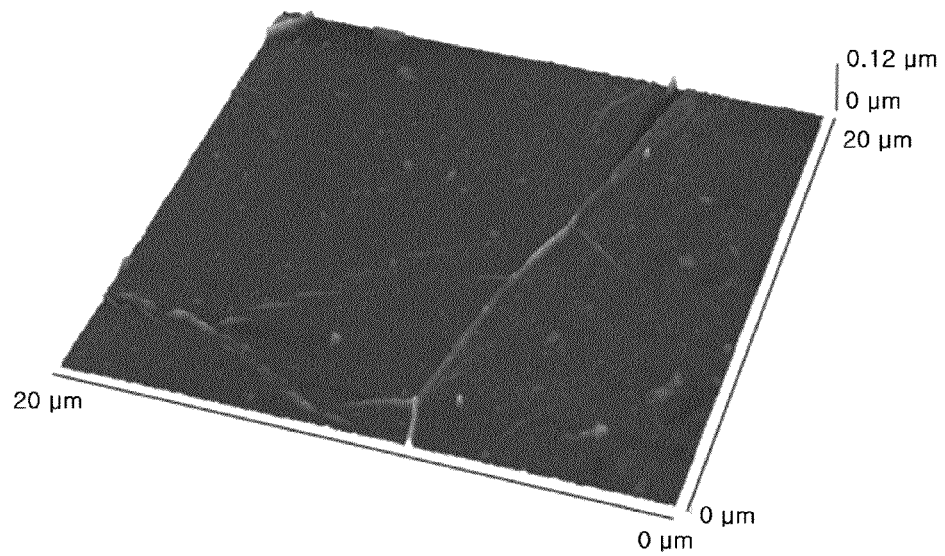
Figure 4:
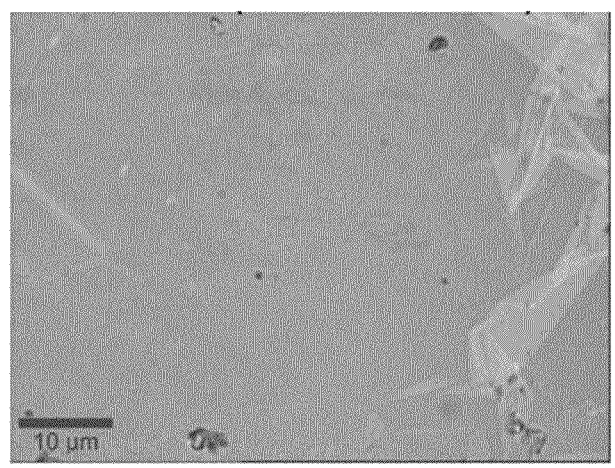
FIG. 4 is an optical microscope (OM) image of the graphene sheet obtained by the first heat treatment in Example 1.

AEM images and an OM image of the graphene sheet are respectively illustrated in FIGS. 3A and 3B, and FIG. 4. Referring to FIGS. 3A and 3B, and FIG. 4, it may be understood that graphene was formed as a layer in the form of sheet.

Figure 5:
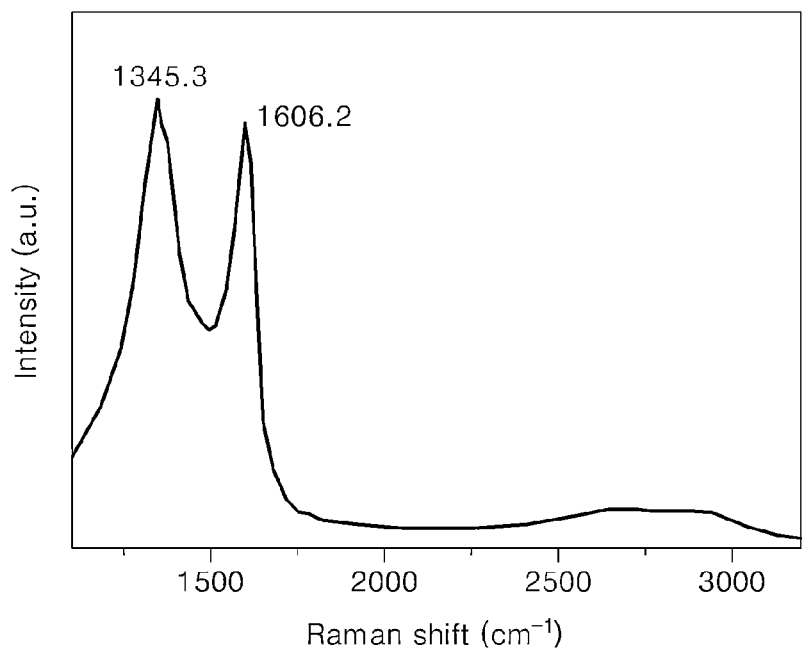
FIG. 5 is a Raman spectrum of the graphene sheet obtained by the first heat treatment in Example 1.

A Raman spectrum of the graphene sheet is illustrated in FIG. 5. Referring to FIG. 5, the formation of a graphene sheet having a nanoscale thickness was identified by the presence of the D peak near about 1345 $cm^{-1}$ and the G peak near about 1600 $cm^{-1}$.

Also, a step height between the graphene sheet and the surface of the $SiO_2$ substrate was measured by cross section scanning, and as a result, it was confirmed that an average thickness of the formed graphene sheet was about 11.28 nm.

Experimental Example 2

Identification of Graphene Sheet/h-BN Sheet Heterogeneous Laminated Structure

In order to identify the graphene sheet/h-BN sheet heterogeneous laminated structure finally synthesized in Example 1, the laminated graphene sheet/h-BN sheet was analyzed by using an AFM, an OM, and a Raman spectrum.

Figure 6A:
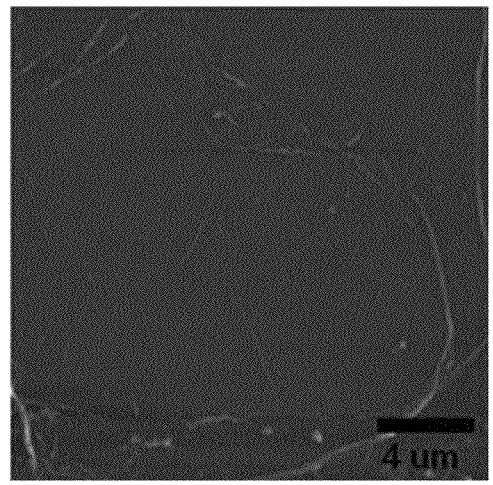
FIGS. 6A and 6B are respectively AFM images of an insulating sheet having a heterogeneous laminated structure of a graphene sheet/h-BN sheet that is finally synthesized in Example 1.
Figure 6B:
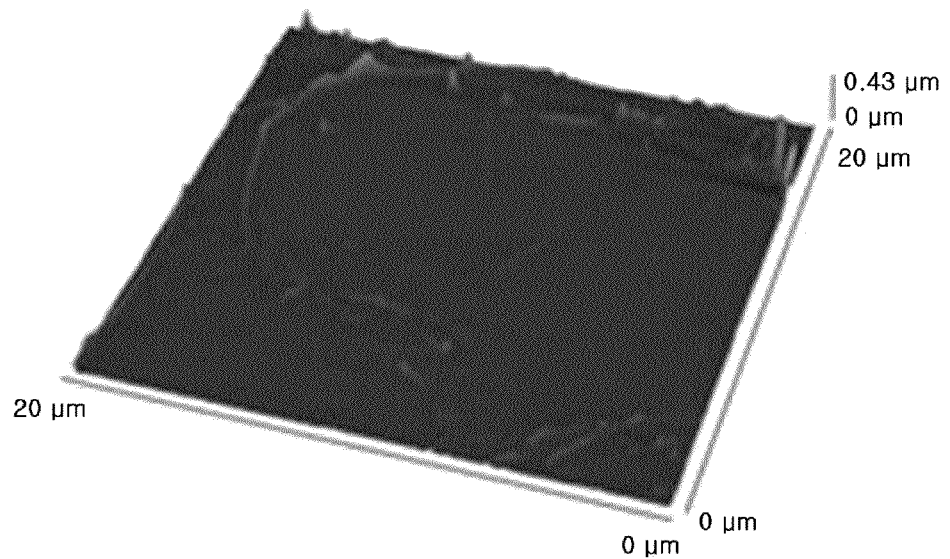
Figure 7:
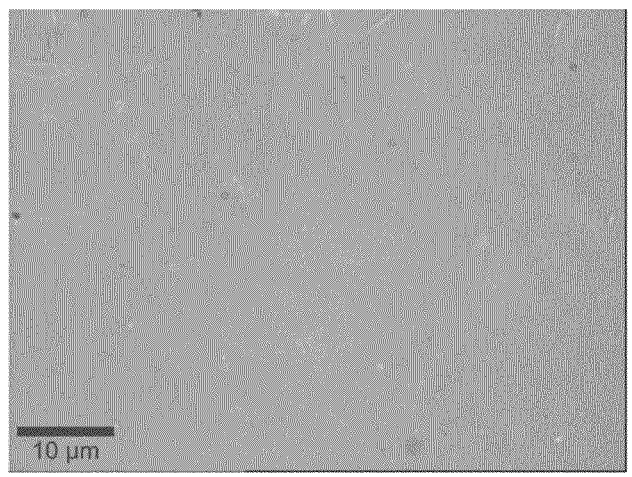
FIG. 7 is an optical microscope (OM) image of the insulating sheet having the heterogeneous laminated structure of the graphene sheet/h-BN sheet that is finally synthesized in Example 1.

AEM images and an OM image of the graphene sheet/h-BN sheet are respectively illustrated in FIGS. 6A and 6B, and FIG. 7. Referring to FIGS. 6A and 6B, and FIG. 7, it may be understood that a very flat sheet structure having a large area was formed. A RMS surface roughness measured by the AFM was about 0.462 nm and thus, it was confirmed that the graphene sheet/h-BN sheet has a very flat surface.

Figure 8:
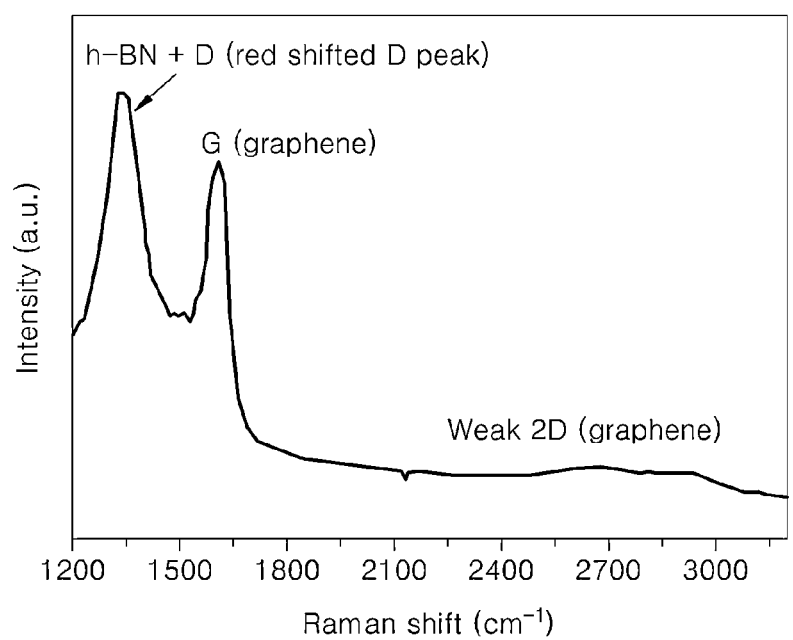
FIG. 8 is a Raman spectrum of the insulating sheet having the heterogeneous laminated structure of the graphene sheet/h-BN sheet that is finally synthesized in Example 1.
Figure 9A:
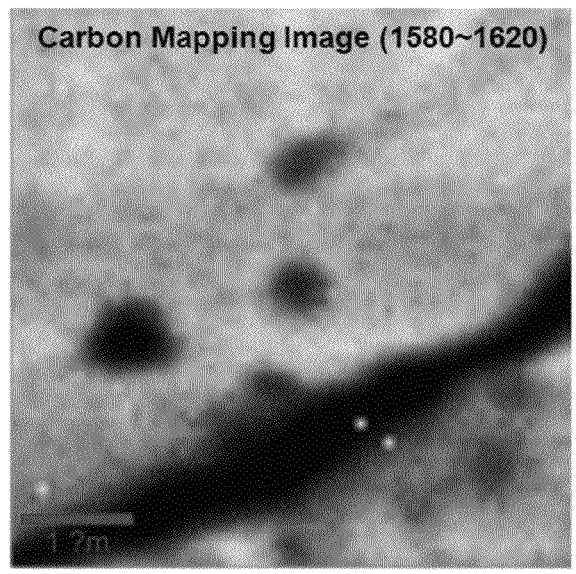
FIGS. 9A and 9B are respectively Raman mapping images of the insulating sheet having the heterogeneous laminated structure of the graphene sheet/h-BN sheet that is finally synthesized in Example 1.
Figure 9B:
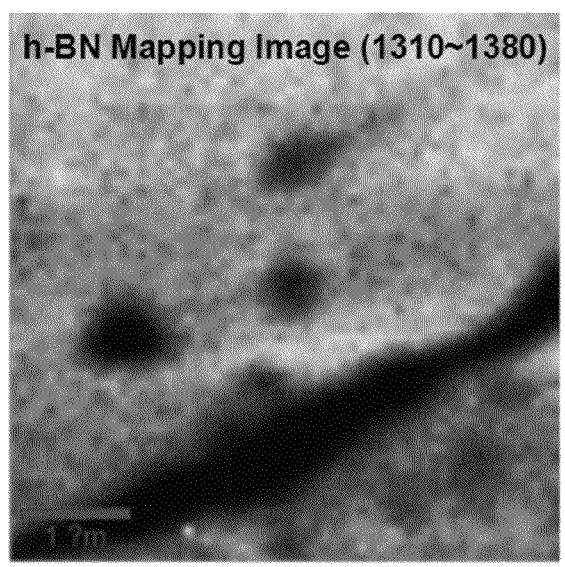

Also, a Raman spectrum and Raman mapping images of the graphene sheet/h-BN sheet are respectively illustrated in FIG. 8 and FIGS. 9A and 9B. Referring to the Raman spectrum of the h-BN nanosheet/graphene sheet of FIG. 8, a peak of h-BN at about 1357 cm$^{-1}$ to about 1360 cm$^{-1}$ that was slightly shifted to the right from the D peak, a supper lattice peak of the graphene sheet, and the G peak near about 1600 cm$^{-1}$ were observed, and FIGS. 9A and 9B respectively illustrate results of mapping of the super lattice peak and G peak positions.

FIGS. 9A and 9B are respectively images representing intensities of the Raman spectrum as colors for the supper lattice peak and the G peak, in which bright yellow color was shown as the intensity was strong. In FIGS. 9A and 9B, all regions with bright yellow color were regions including the h-BN/graphene sheet, and since the bright yellow color are distributed over a wide area, it may be confirmed that uniform and continuous h-BN/graphene sheet was presented.

Experimental Example 3

XPS Analysis of Graphene Sheet/h-BN Sheet Heterogeneous Laminated Structure

Figure 10A:
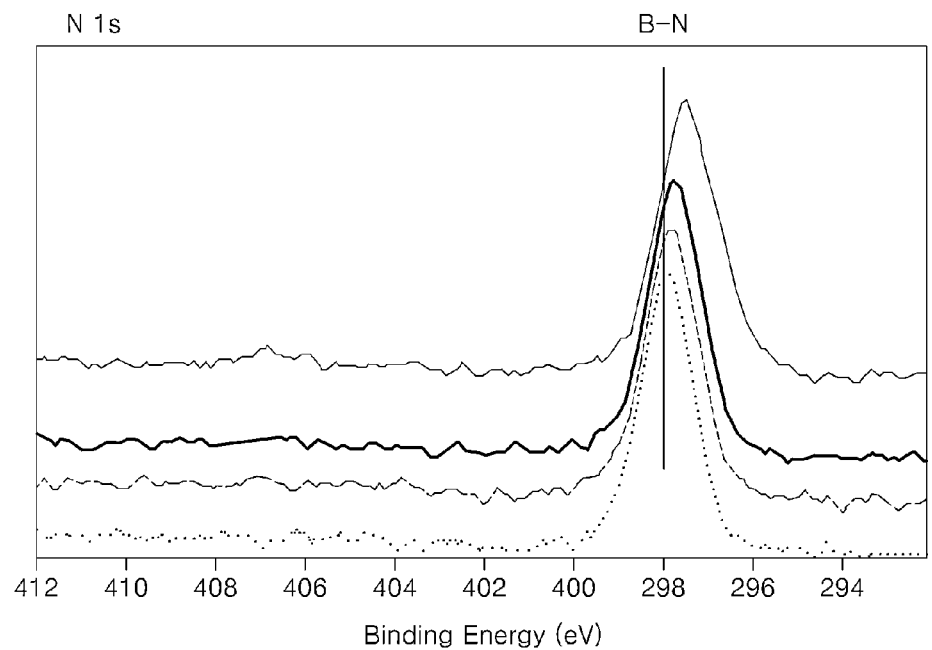
FIGS. 10A through 10C respectively illustrate results of X-ray photoelectron spectroscopy (XPS) analysis for the insulating sheet having the heterogeneous laminated structure of the graphene sheet/h-BN sheet that is finally synthesized in Example 1 while increasing an angle of an incident beam.
Figure 10B:
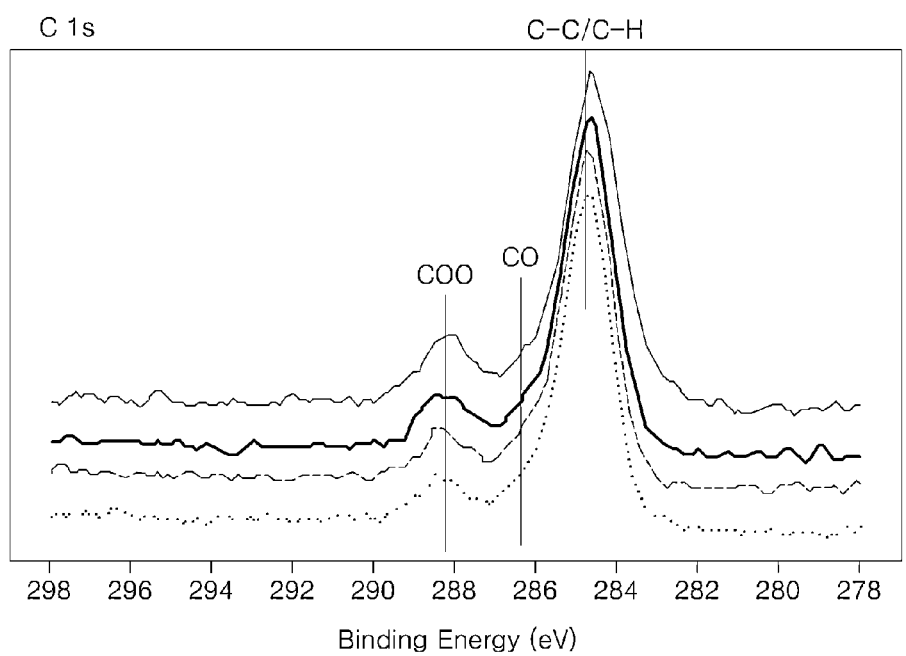
Figure 10C:
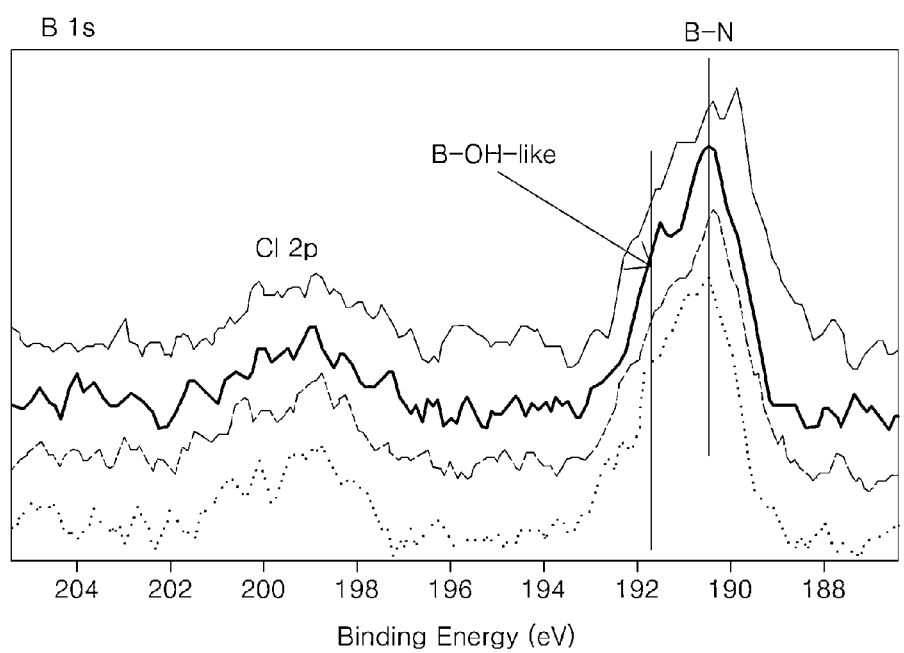

The insulation sheet having a graphene sheet/h-BN sheet heterogeneous laminated structure finally synthesized in Example 1 was analyzed by XPS while increasing an angle of an incident beam, and results thereof are presented in FIGS. 10A to 10C.

Referring to FIGS. 10A to 10C, an increase in C—C bonding may be confirmed as the incident angle increases, and it may be understood that the insulating sheet had a laminated structure in which a C component (graphene component) was disposed on a bottom side thereof. Also, it may be understood that B—N bonding and C—C bonding were presented, but B—C bonding and N—C bonding were absent. This may indicate that a hybrid structure bonding between B and C or N and C was not presented.

Experimental Example 4

EELS Analysis of Graphene Sheet/h-BN Sheet Heterogeneous Laminated Structure

Elements of the insulation sheet having a graphene sheet/h-BN sheet heterogeneous laminated structure finally synthesized in Example 1 were analyzed at a nanometer level by EELS in a TEM.

Figure 11:
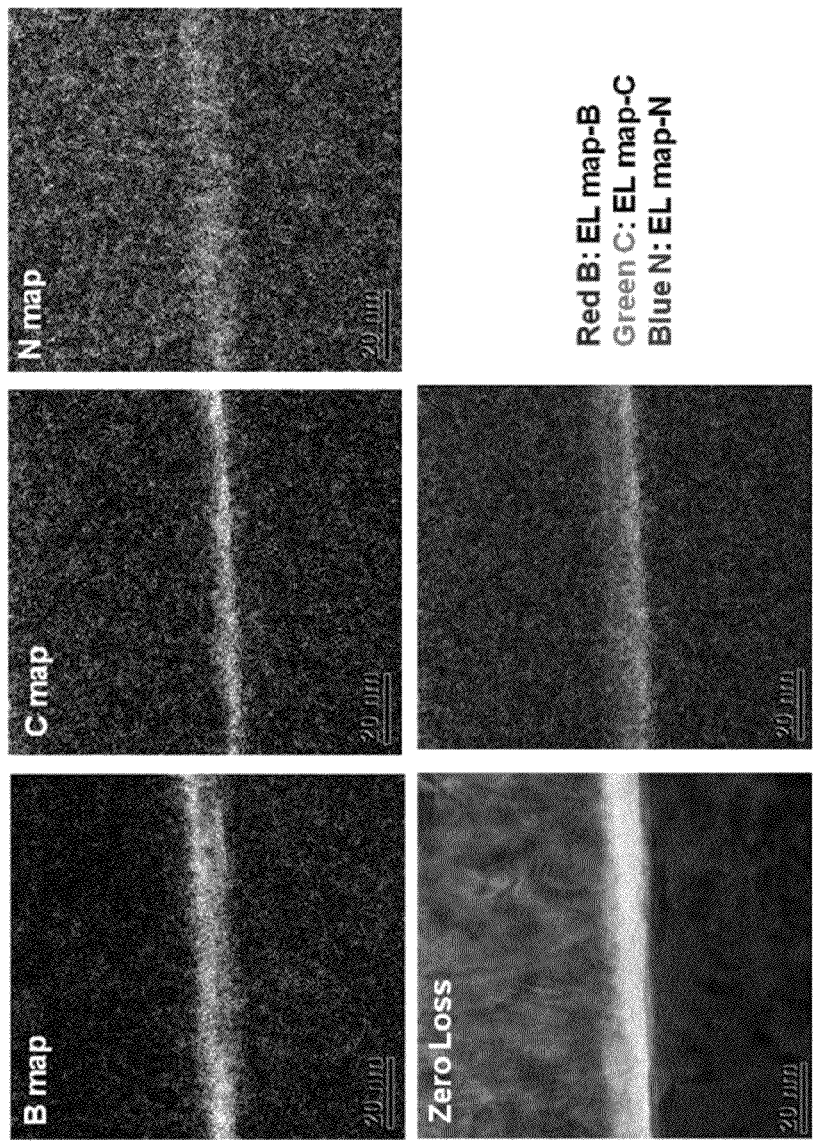
FIG. 11 illustrates results of elemental mapping of a cross section of the insulating sheet having the heterogeneous laminated structure of the graphene sheet/h-BN sheet that is finally synthesized in Example 1 analyzed by electron energy loss spectroscopy (EELS) in a transmission electron microscope (TEM)

Results of elemental mapping of a cross section of the heterogeneous laminated structure are illustrated in FIG. 11. In FIG. 11, a mapping image of each element, such as B, C, and N, was black and white. However, electrons nonelastically scattered by each element, such as B, C, and N, may be energetically selected and distributed into each color of red, green, and blue (RGB) to obtain color images.

As illustrated in FIG. 11, it may be understood from the results of mapping of each element, such as B, C, and N, that B and C were apparently separated into two layers.

Experimental Example 5

Figure 12A:
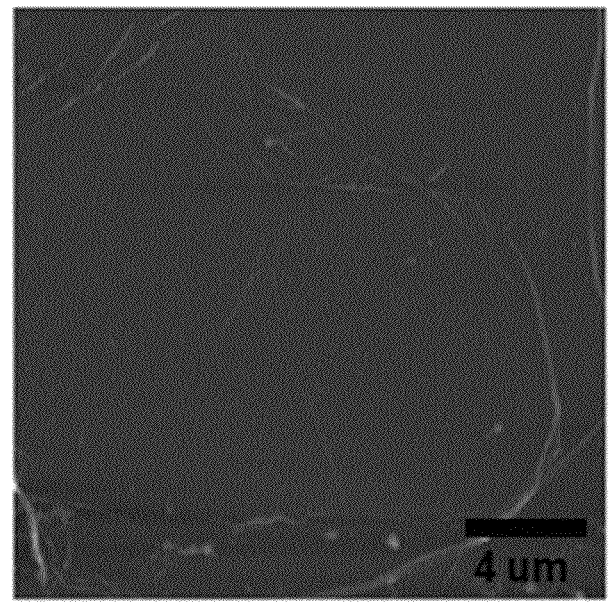
FIGS. 12A through 12C respectively are optical images of an insulating sheet after the insulating sheet having the heterogeneous laminated structure of the graphene sheet/h-BN sheet that is finally synthesized in Example 1 is transferred to a $SiO_2$ substrate.
Figure 12B:
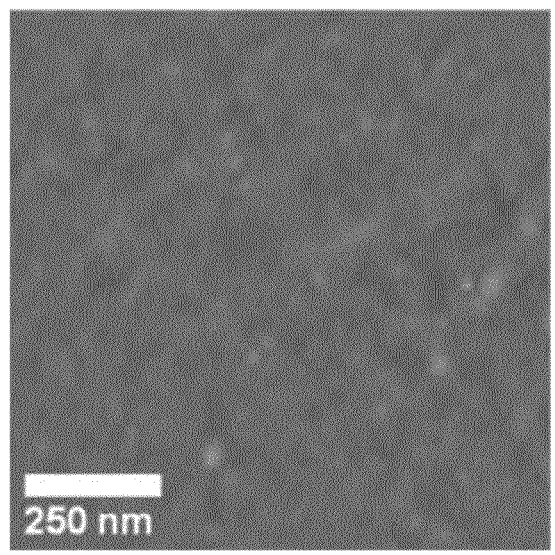
Figure 12C:
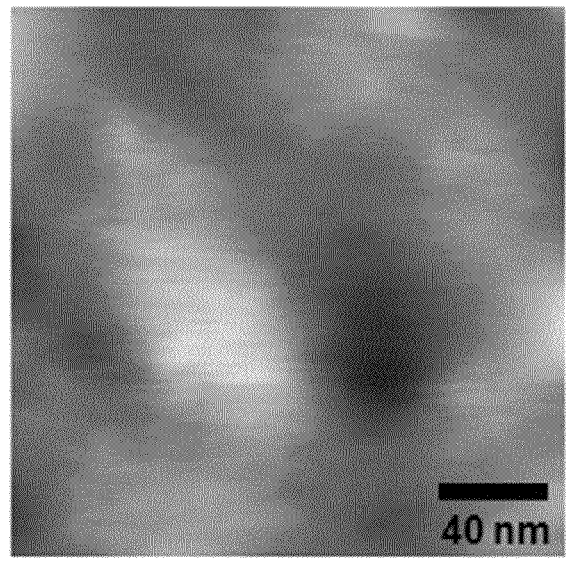

Surface Roughness Analysis of Graphene Sheet/h-BN Sheet Heterogeneous Laminated Structure The insulation sheet having a graphene sheet/h-BN sheet heterogeneous laminated structure finally synthesized in Example 1 was transferred to a SiO$_2$ substrate and optical images of the insulating sheet are respectively illustrated in FIGS. 12A, 12B, and 12C.

As illustrated in FIGS. 12A, 12B, and 12C, it may be understood that the insulation sheet having a graphene sheet/h-BN sheet heterogeneous laminated structure that had been transferred to the SiO$_2$ substrate had a RMS surface roughness of about 2.253 nm in a region having an area of about 20 μm×20 μm, had a RMS surface roughness of about 0.486 nm in a region having an area of about 1 μm×1 μm, and had a RMS surface roughness of about 0.462 nm in a region having an area of about 0.2 μm×0.2 μm.

Figure 13:
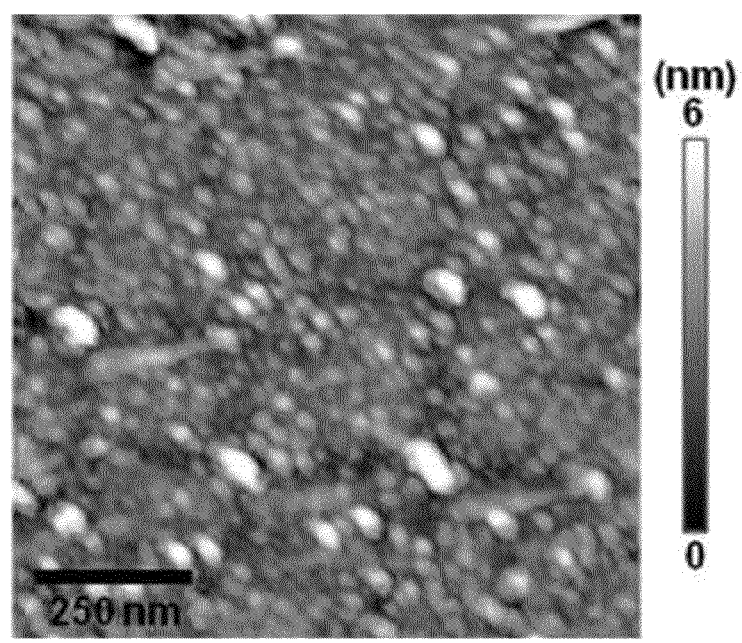
FIG. 13 is an AFM image illustrating surface characteristics of the $SiO_2$ substrate itself.

For comparison, an AFM image illustrating surface characteristics of the SiO$_2$ substrate itself is illustrated in FIG. 13.

When compared with the SiO$_2$ substrate, it may be understood that the insulation sheet having a graphene sheet/h-BN sheet heterogeneous laminated structure also exhibited very flat characteristics in a wider region as well as a microscopic region after being transferred to the SiO$_2$ substrate.

Experimental Example 6

Insulating Property Analysis of Graphene Sheet/h-BN Sheet Heterogeneous Laminated Structure In order to identify insulating properties of the insulating sheet having a graphene sheet/h-BN sheet heterogeneous laminated structure finally synthesized in Example 1, a comparative test device was first prepared by depositing a silver electrode having an area of about 1 mm×1 mm on a p-type Si substrate having about 300 nm of SiO$_2$ deposited thereon to a thickness of about 100 nm by using a thermal evaporator. Also, the insulating sheet having a graphene sheet/h-BN sheet heterogeneous laminated structure manufactured in Example 1 was deposited on the p-type Si substrate having about 300 nm of SiO$_2$ deposited thereon, and a test device was then prepared by depositing a silver electrode having an area of about 1 mm×1 mm to a thickness of about 100 nm by using the thermal evaporator.

Figure 14:
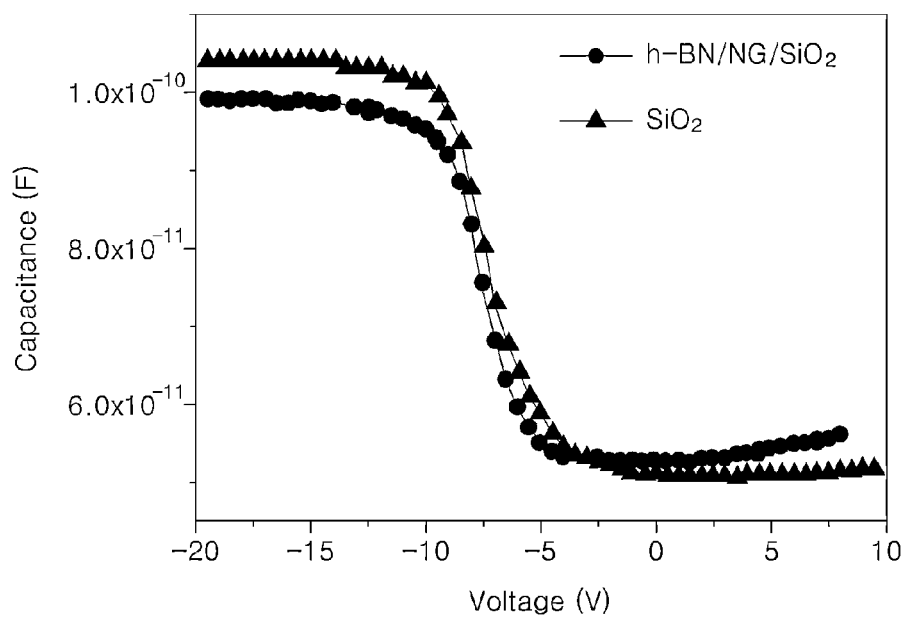
FIG. 14 illustrates results of capacitance measurements for a test device and a comparative test device fabricated for measuring insulating properties of the insulating sheet obtained in Example 1.

Bottom surfaces of the test device and the comparative test device were respectively connected to copper plates using a silver paste and the top silver electrodes and the copper plates were then respectively connected to a LCR meter to measure capacitances according to voltage changes. Results thereof are presented in FIG. 14. As a result of the capacitance measurements in FIG. 14, a capacitance of h-BN/graphene sheet/SiO$_2$ was about 9.91×10$^{-9}$ F/cm$^2$ and a capacitance of SiO$_2$ was about 1.04×10$^{-8}$ F/cm$^2$. When each capacitance was denoted as C1 (h-BN/graphene sheet/SiO$_2$), C2 (SiO$_2$), and C3 (h-BN/graphene sheet), since C1 may be considered as a capacitor in which C2 and C3 are connected in series, an equation, 1/C1=1/C2+1/C3, is established. Therefore, when C3 was calculated from the above equation, a value of C3 was about 2.10×10$^{-7}$ F/cm$^2$. Capacitance may be expressed by an equation, C=∈$_0$∈A/d (where ∈$_0$=a dielectric constant of vacuum, ∈=a dielectric constant of h-BN/graphene sheet, A=an area of the capacitor=about 1 mm$^2$, and d=a thickness of the capacitor=about 14.5 nm), and according to the above equation, the insulating sheet having a heterogeneous laminated structure obtained in Example 1 had a dielectric constant of about 3.45. This value is very similar to the dielectric constant of an h-BN single crystal, and it may be understood that electrical insulating properties of the insulating sheet were desirable.

Example 2

Figure 15:
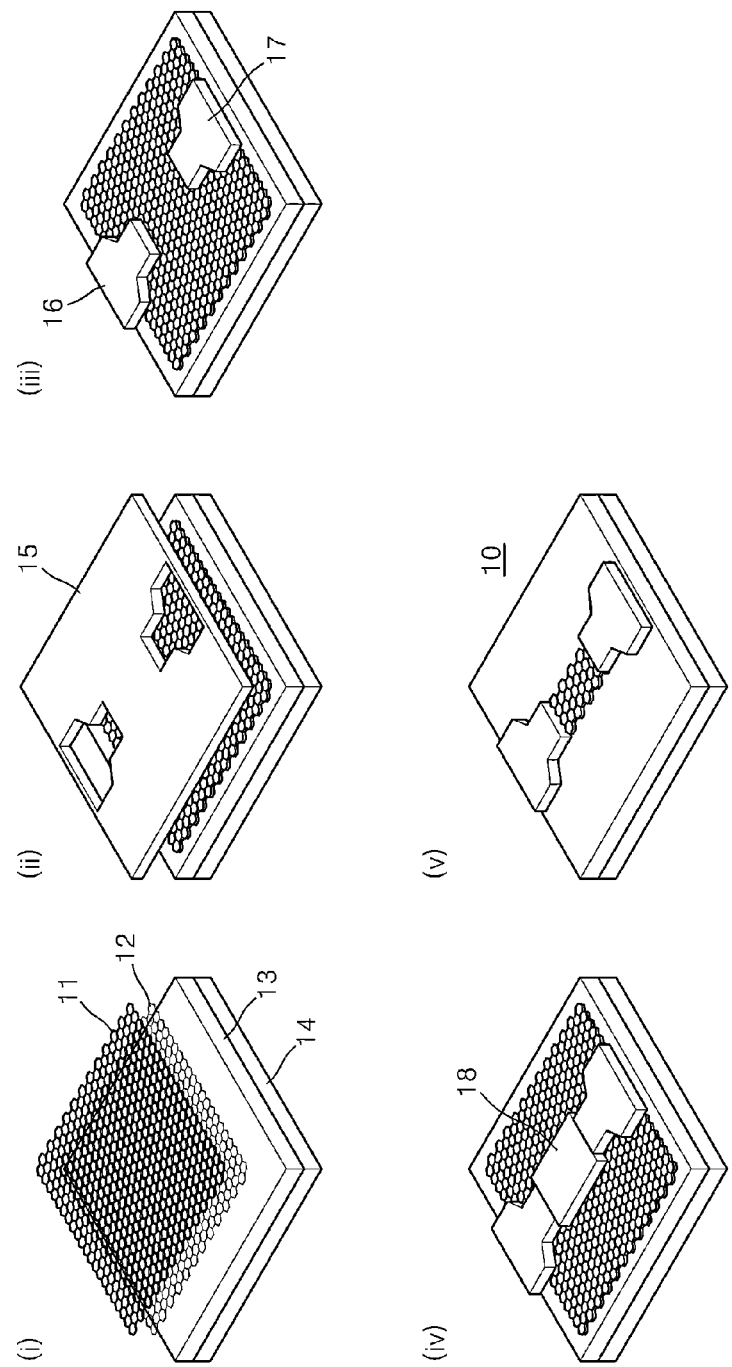
FIG. 15 is a schematic view illustrating a fabrication process of a graphene-based FET using the insulating sheet obtained in Example 1.

As illustrated in FIG. 15, a graphene-based FET using the insulating sheet having a graphene sheet/h-BN sheet heterogeneous laminated structure manufactured in Example 1 was fabricated.

An insulating sheet 12 having a graphene sheet/h-BN sheet heterogeneous laminated structure obtained in Example 1 was transferred to silicon (n-Si)/silica ($SiO_2$) substrates 13 and 14 having an area of about 2.5 cm×2.5 cm and a respective thickness of about 525 μm and about 300 nm. Subsequently, single-layer thick graphene 11 was transferred to the h-BN sheet of the insulating sheet.

Thereafter, Ti/Au electrodes 16 and 17 were deposited on the graphene by using photolithography 15 to form source/drain electrodes. Then, a FET structure having a channel length of about 10 μm and a channel width of about 2 μm was fabricated by using photolithography 18 and etching the graphene 11 and the insulating sheet 12 with $O_2$ plasma.

Comparative Example 2

Single-layer thick graphene was transferred to silicon (n-Si)/silica ($SiO_2$) substrates having an area of about 2.5 cm×2.5 cm and a respective thickness of about 525 μm and about 300 nm.

Thereafter, Ti/Au electrodes were deposited on the graphene by using photolithography, and subsequently, a FET structure having a channel length of about 10 μm and a channel width of about 2 μm was fabricated by using photolithography and etching the graphene with $O_2$ plasma.

Experimental Example 7

Electrical Property Analysis of FET

Figure 16:
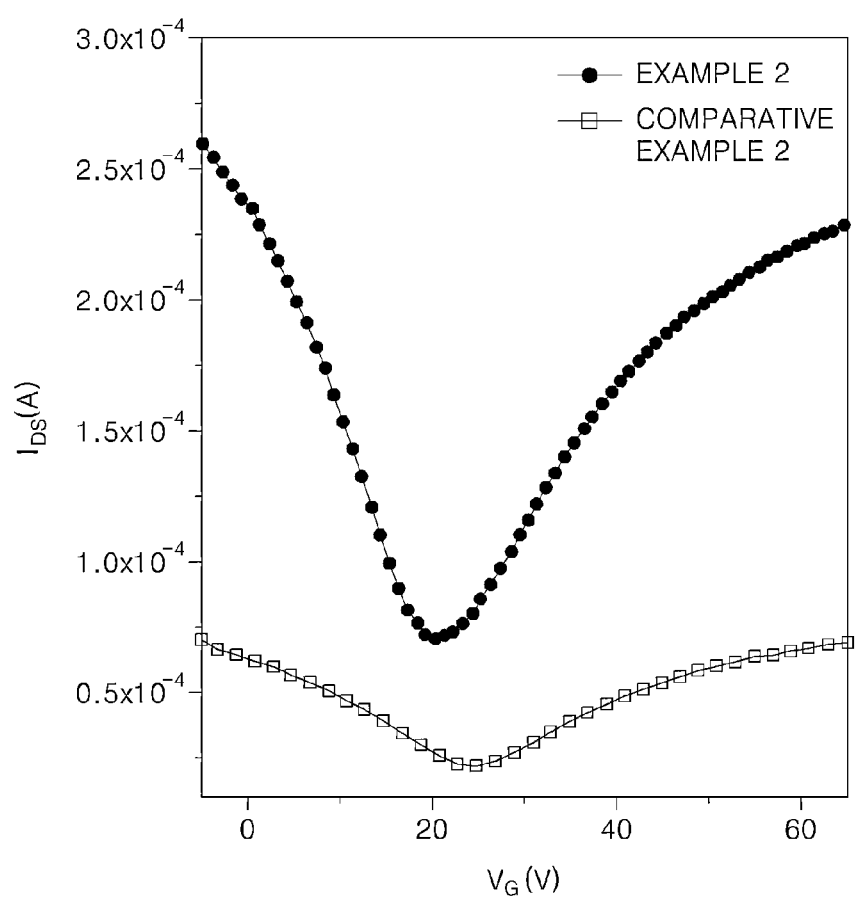
FIG. 16 is a current vs. voltage graph for FET devices obtained in Example 1 and Comparative Example 2.

An amount of drain current ($I_{DS}$) generated from a source and a drain by applying a given (or alternatively, predetermined) voltage to a gate was measured for the FET devices obtained in Example 2 and Comparative Example 2, and results thereof are illustrated in an $I_{DS}$-$V_G$ graph of FIG. 16.

Referring to the $I_{DS}$-$V_G$ graph of FIG. 16, with respect to the FET in Comparative Example 2, a charge mobility of the graphene channel/$SiO_2$ substrate was about 504.8077 (h) $cm^2/V_s$, and with respect to the FET in Example 2, a charge mobility of the graphene channel/h-BN/NG/$SiO_2$ substrate was about 3916.1982 (h) $cm^2/V_s$.

As described above, it may be understood that performance of the FET of Example 2 using the insulating sheet having the graphene sheet/h-BN sheet heterogeneous laminated structure was improved by about 8 times in comparison to the FET of Comparative Example 2 having no insulating sheet included therein. This may be due to the fact that the insulating sheet was used as a buffer layer to prevent or reduce scattering effects during the movement of charges in the graphene channel layer.

Since the insulating sheet having the heterogeneous laminated structure includes a hexagonal boron nitride sheet having desirable surface characteristics on a large-area graphene sheet, the insulating sheet may be used in various electrical devices including a transistor. When a graphene channel layer using the insulating sheet as a substrate is realized as a FET, electron mobility characteristics may be significantly improved.

While the inventive concepts have been particularly shown and described with reference to example embodiments thereof, it will be understood by those of ordinary skill in the art that various changes in form and details may be made therein without departing from the spirit and scope of the following claims.

What is claimed is:

1. An insulating sheet having a heterogeneous laminated structure, the insulating sheet comprising:
   a graphene sheet; and
   a hexagonal boron nitride sheet on the graphene sheet, the hexagonal boron nitride sheet having a root mean square (RMS) surface roughness of about 0.5 nm or less in a region having an area of aboiit 200 nm×200 nm or less, and one or more of longitudinal and transverse lengths of about 1 mm or more, wherein
   the graphene sheet includes at least one polycyclic aromatic sheet in which a plurality of carbon atoms are arranged on a single plane and connected by covalent bonds, and
   a thickness of the graphene sheet is about 30 nm or less.

2. The insulating sheet having the heterogeneous laminated structure of claim 1, wherein the hexagonal boron nitride sheet has a RMS surface roughness of about 2.5 nm or less in a region having an area of about 20 μm×20 μm or more.

3. The insulating sheet having the heterogeneous laminated structure of claim 1, wherein
   the hexagonal boron nitride sheet has a two-dimensional planar structure in which a boron (B)-nitrogen (N) bond is a $sp^2$ covalent bond is a van der Waals bond, and
   a thickness of the hexagonal boron nitride sheet is about 30 nm or less.

4. The insulating sheet having the heterogeneous laminated structure of claim 1, wherein a dielectric constant of the insulating sheet is in a range of about 2 to about 4.

5. An electrical device comprising a laminated structure, the laminated structure comprising:
   the insulating sheet having the heterogeneous laminated structure of claim 1; and
   a graphene channel layer on the hexagonal boron nitride sheet.

6. A method of manufacturing an insulating sheet having a heterogeneous laminated structure, the method comprising:
   forming a graphene sheet by performing a first heat treatment while introducing a gas-phase carbon source in the presence of a metal catalyst;
   forming an amorphous boron nitride layer on the graphene sheet while providing gas-phase nitrogen and boron sources in a state in which a reactor is cooled; and
   recrystallizing the amorphous boron nitride layer into a hexagonal boron nitride sheet by performing a second heat treatment on the amorphous boron nitride layer.

7. The method of claim 6, wherein the forming a graphene sheet, the forming an amorphous boron nitride layer, and the recrystallizing the amorphous boron nitride layer are performed in a same reactor.

8. The method of claim 6, wherein the forming a graphene sheet includes introducing at least one of carbon monoxide, ethane, ethylene, ethanol, acetylene, propane, propylene, butane, butadiene, pentane, pentene, cyclopentadiene, hexane, cyclohexane, benzene, and toluene.

9. The method of claim 6, wherein the forming a graphene sheet performs the first heat treatment in the presence of at least one of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), zirconium (Zr), and an alloy thereof.

10. The method of claim 6, wherein the forming a graphene sheet performs the first heat treatment at a temperature ranging from about 300° C. to about 1500° C.

11. The method of claim 6, wherein the forming a graphene sheet performs the first heat treatment for a given amount of time such that a thickness of the graphene sheet is about 30 nm or less.

12. The method of claim 6, wherein the forming an amorphous boron nitride layer provides gas-phase nitrogen and boron sources in the state in which the reactor is cooled to a temperature in a range of about 70° C. to about 800° C.

13. The method of claim 6, wherein the forming an amorphous boron nitride layer provides at least one of $NH_3$ and $N_2$, and at least one of $BH_3$, $BF_3$, $BCl_3$, $B_2H_6$, $(CH_3CH_2)_3B$, and $(CH_3)_3B$.

14. The method of claim 6, wherein the forming an amorphous boron nitride layer provides at least one of $H_3NBH_3$ and $(BH)_3(NH)_3$.

15. The method of claim 6, wherein the recrystallizing performs the second heat treatment at a temperature ranging from about 500° C. to about 1500° C.

16. The method of claim 6, wherein the forming a graphene sheet, the forming an amorphous boron nitride layer, and the recrystallizing the amorphous boron nitride layer are independently performed in the presence of one of an inert gas, a hydrogen gas, and a mixed gas.

* * * * *